United States Patent
Tan et al.

(10) Patent No.: US 10,141,960 B2
(45) Date of Patent: Nov. 27, 2018

(54) SYSTEM FOR AND METHOD OF REDUCING TRANSMIT SIGNAL DISTORTION

(71) Applicant: Avago Technologies International Sales Pte. Limited, Singapore (SG)

(72) Inventors: Loke K. Tan, Newport Coast, CA (US); Takayuki Hayashi, Lake Forest, CA (US); Lin He, Irvine, CA (US); Giuseppe Cusmai, Mission Viejo, CA (US); Chun-ying Chen, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/363,841

(22) Filed: Nov. 29, 2016

(65) Prior Publication Data

US 2018/0123622 A1     May 3, 2018

Related U.S. Application Data

(60) Provisional application No. 62/415,774, filed on Nov. 1, 2016.

(51) Int. Cl.
*H04B 1/04* (2006.01)
*H04W 52/52* (2009.01)
*H03F 3/00* (2006.01)

(52) U.S. Cl.
CPC ............ *H04B 1/0475* (2013.01); *H03F 3/00* (2013.01); *H04W 52/52* (2013.01); *H04B 2001/0408* (2013.01)

(58) Field of Classification Search
CPC ............ H04B 10/25751; H04B 1/0475; H04B 2001/0425; H04B 10/25759; H04B 3/23
USPC ...................................... 455/114.3
See application file for complete search history.

(56) References Cited

U.S. PATENT DOCUMENTS

| | | | | |
|---|---|---|---|---|
| 2002/0027958 A1* | 3/2002 | Kolanek | ............... | H03F 1/0294 375/297 |
| 2002/0191684 A1* | 12/2002 | Min | ........................ | H04L 5/023 375/222 |
| 2004/0119534 A1* | 6/2004 | Chandrasekaran | ... | H03F 1/3229 330/149 |

* cited by examiner

*Primary Examiner* — Ajibola Akinyemi
(74) *Attorney, Agent, or Firm* — Foley & Lardner LLP

(57) ABSTRACT

Systems and methods relate to providing a transmit signal. The transmit signal can be provided in a transmitter circuit including a main pre-equalizer, a main power amplifier in communication with the main pre-equalizer, a replica pre-equalizer, and a replica power amplifier in communication with the replica pre-equalizer. The replica preamplifier is in communication with the main pre-equalizer, and control signals are provided to the main pre-equalizer to reduce distortion. The control signals are provided in response to an output signal of the replica power amplifier.

19 Claims, 3 Drawing Sheets

SYSTEM FOR AND METHOD OF REDUCING TRANSMIT SIGNAL DISTORTION

CROSS-REFERENCE TO RELATED APPLICATIONS

This application claims the benefit of and priority to U.S. Provisional Application No. 62/415,774, entitled "SYSTEM FOR AND METHOD OF REDUCING TRANSMIT SIGNAL DISTORTION," filed on Nov. 1, 2016, which is hereby incorporated by reference herein in its entirety.

FIELD OF THE DISCLOSURE

This disclosure generally relates to systems for and methods of providing transmit signals.

BACKGROUND OF THE DISCLOSURE

Transmitters are used in a large number of applications, including various communication and sensing applications. Communication and sensing applications can include, but are not limited to, those associated with modems, network nodes, stationary and mobile stations and equipment, access points (APs), mobile devices, positioning systems (e.g., the Global Positioning System (GPS)), cellular telephones, radars, set top boxes, light sensors, heat sensors, targeting sensors, networks, etc.

Transmitters can be employed in any type of modem (e.g., cable modem), workstation, telephone, desktop computer, laptop, notebook computer, server, handheld computer, mobile telephone, other portable telecommunications device, media playing device, gaming system, mobile computing device, sensor, radar, or any other type and/or form of sensing, computing, positioning, telecommunication or media device. In many transmitter applications (e.g., wireless devices, cable modem, etc.), the transmitter provides a transmit signal to a power amplifier via an adaptive pre-equalizer. The adaptive pre-equalizer is used to correct impairments or distortion caused by the power amplifier. The term transmitter as used herein refers to a transmitter or a combination transmitter and receiver (e.g., a transceiver).

BRIEF DESCRIPTION OF THE DRAWINGS

Various objects, aspects, features, and advantages of the disclosure will become more apparent and better understood by referring to the detailed description taken in conjunction with the accompanying drawings. In the drawings, like reference numbers generally indicate identical, functionally similar, and/or structurally similar elements.

DETAILED DESCRIPTION OF EMBODIMENTS

Figure 1:
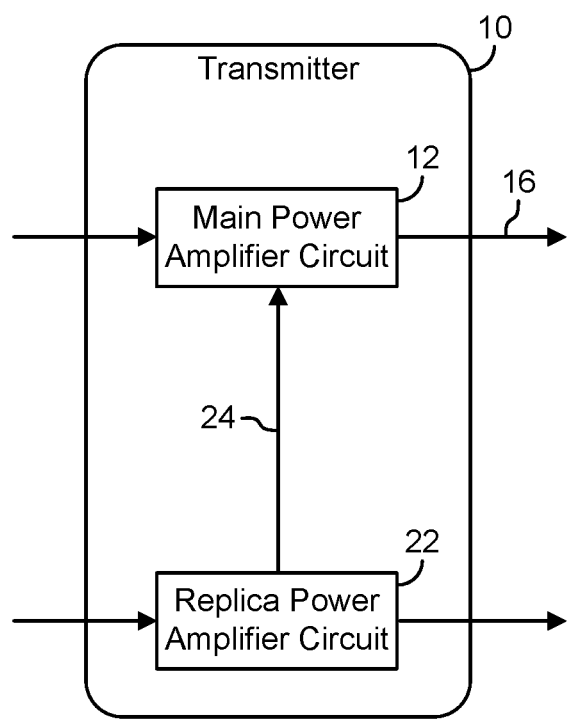
FIG. 1 is a general block diagram of a transmitter according to some embodiments.

According to some embodiments, methods and systems are used to correct impairments (e.g., distortion) in a transmit signal. Advantageously, the impairments are generally detected using a training signal and corrected using an adaptive pre-equalizer in some embodiments. Training the adaptive pre-equalizer using the transmit signal as a blind signal is not always a reliable technique because, for example, the transmit signal may not always be present and is often a burst signal. Further, using the transmit signal as a blind signal often can require rapid re-acquisition of the adaptive pre-equalizer.

Systems for and methods of reducing distortion in a transmitter use a replica block or circuit to develop control signals for a main pre-distortion circuit (e.g., a main adaptive pre-equalizer) in some embodiments. The pre-distortion circuit is used to reduce distortion due to a main power amplifier or other circuit which creates impairment. The replica circuit includes a replica amplifier (e.g., a scaled version of the main power amplifier) and a replica pre-distortion circuit and is used to periodically train or configure the main pre-distortion circuit in some embodiments.

A feedback loop using the replica power amplifier and replica pre-distortion circuit allows coefficients to be determined for the main pre-distortion circuit in some embodiments. After training, the coefficients used in the replica pre-distortion circuit are transferred to the main pre-distortion circuit in some embodiments, thereby achieving the correction of the impairment caused by the main power amplifier or other circuit.

The main power amplifier is operated in a lower power mode that results in distortion levels greater than the distortion level associated with a higher power mode in some embodiments. In some embodiments, the main pre-distortion circuit responds to the control signal so that the distortion level of the power amplifier is at or lower than the distortion level associated with the higher power mode despite the power amplifier being operated in the lower power mode.

Some embodiments relate to a transmitter circuit. The transmitter circuit includes a main pre-equalizer, a main power amplifier in communication with the main pre-equalizer, a replica pre-equalizer, and a replica power amplifier in communication with the replica pre-equalizer. Control signals are provided to the main pre-equalizer to reduce distortion. The control signals are provided in response to an output signal of the replica power amplifier.

Some embodiments relate to a method of amplifying a transmit signal. The method includes pre-distorting a training signal and amplifying the training signal in a first amplifier. The method also includes using an output signal from the first amplifier to provide a control signal, pre-distorting the transmit signal in accordance with the control signal, and amplifying the transmit signal in a second amplifier. The first amplifier has the same or a similar configuration to the second amplifier.

Some embodiments relate to a modem. The modem includes a main pre-distortion circuit configured to pre-distort a transmit signal according to a set of coefficients or a version of the set of the coefficients and provide a first pre-distorted signal and a main power amplifier configured to amplify the first pre-distorted signal. The modem also includes a replica pre-distortion circuit configured to pre-distort a training signal according the set of coefficients, a replica power amplifier configured to amplify the second pre-distorted signal and provide an amplified signal, and a coefficient computing circuit configured to receive the amplified signal or a version of the amplified signal and provide the set of coefficients.

Figure 2:
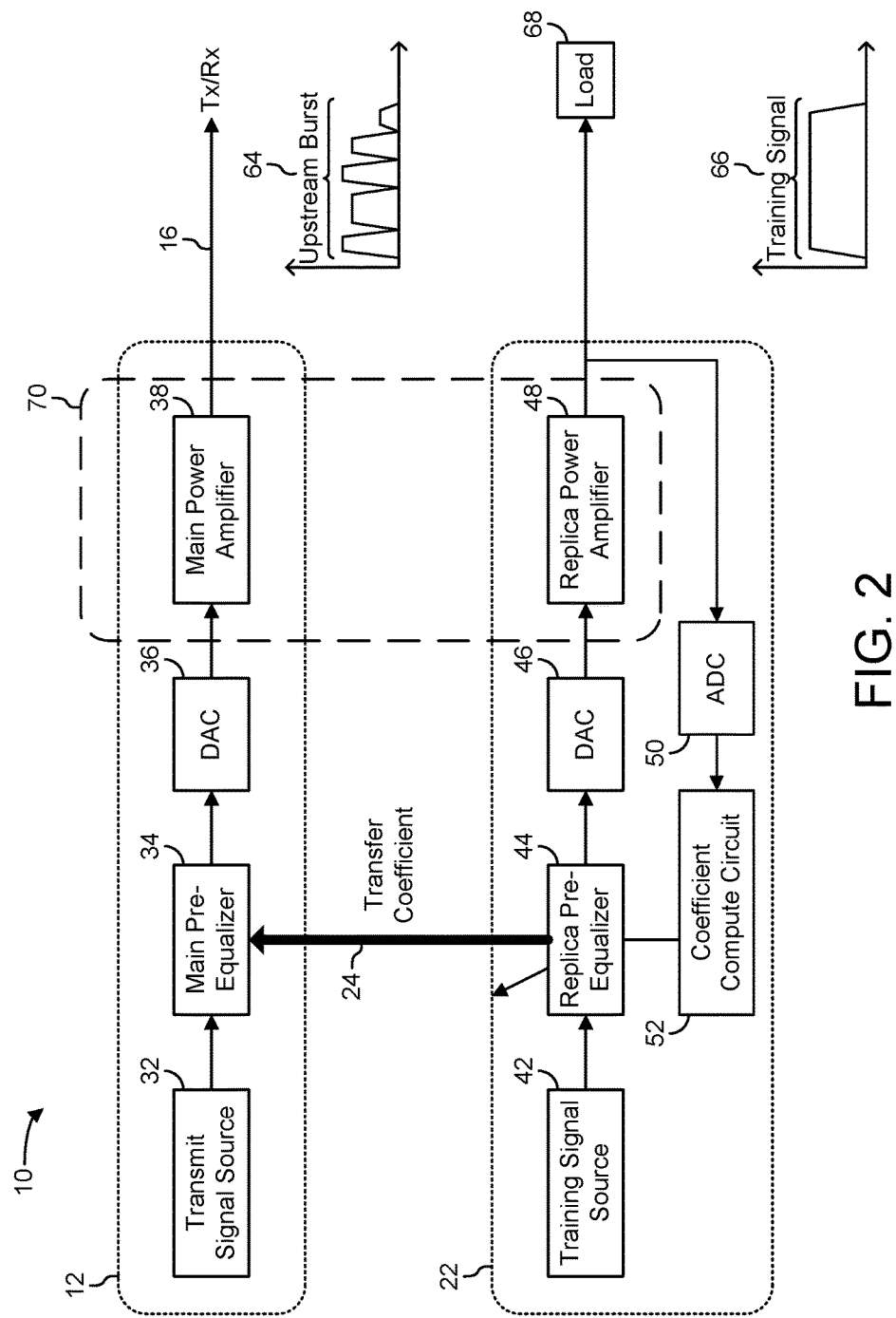
FIG. 2 is a more detailed block diagram of the transmitter illustrated in FIG. 1 according to some embodiments.
Figure 3:
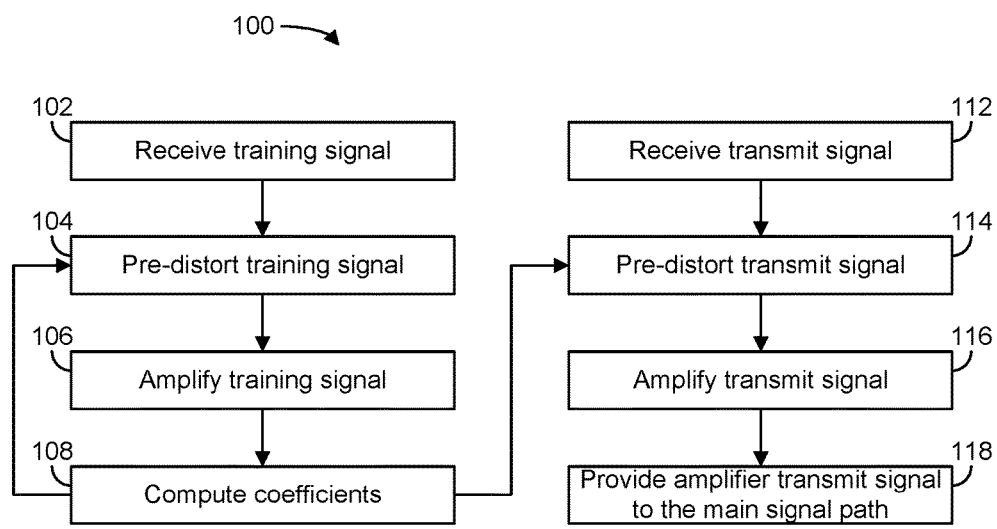
FIG. 3 is a flow diagram showing an exemplary operation of the transmitter illustrated in FIG. 1 according to some embodiments.

With reference to FIGS. 1-3, systems for and methods of providing a transmit signal are employed in a transmitter 10. The transmitter 10 can be used in any type of application, including, but not limited to, communication and sensing applications. The transmitter 10 can be part of a communication, computing, sensing, media, entertain or a networking device in certain embodiments. In some embodiments, the transmitter 10 is part of a network device, a cable modem or wireless device. In some embodiments, the transmitter 10 is a line driver. In some embodiments, the transmitter 10 is part of an access node, workstation, telephone, desktop computer, laptop, notebook computer, server, handheld computer, mobile telephone, other portable telecommunications device, media playing device, gaming system, mobile computing device, sensor, radar, or any other type and/or form of sensing, computing, positioning, telecommunication or media device.

In some embodiments, the transmitter 10 includes a main power amplifier circuit 12 and a replica power amplifier circuit 22. The transmitter 10 provides an amplified transmit signal at an output or signal line 16. The signal line 16 is a cable modem upstream signal path in some embodiments. The signal line 16 can be coupled with any type of interface for the transmit signal.

In some embodiments, the amplified transmit signal is not a consistent signal. In some embodiments, the amplified transmit signal is a burst signal associated with cable modem or wireless communications.

The main power amplifier circuit 12 pre-distorts the transmit signal in accordance with control signals provided on a control bus or control line 24. The control line 24 is coupled the main power amplifier circuit 12 and the replica power amplifier circuit 22. The control line 24 is a multi-bit data bus for supplying coefficients to the main power amplifier circuit 12 in some embodiments. The control line 24 is a single line or a set of lines coupled to filter taps in some embodiments.

The control signals are provided by the replica power amplifier circuit 22 in some embodiments. The control signals are one or more coefficients that configure or control the pre-distortion of the transmit signal in the main power amplifier circuit. The replica power amplifier circuit 22 uses feedback associated with a training signal to calculate the one or more coefficients in some embodiments. The training signal is a user defined signal (e.g., a non-burst signal) in some embodiments.

The main power amplifier circuit 12 is operated in a lower power mode (e.g., lower current mode) that results in distortion levels greater than the distortion level associated with a higher power mode in some embodiments. In some embodiments, the main power amplifier circuit 12 responds to the control signal so that the distortion level of the main power amplifier circuit 12 is at the level of the higher power mode despite being operated in the lower power mode. In some embodiments, the lower power mode is at a power level less than the ideal operating mode for the transmitter 10.

The hardware content of the transmitter 10 shown in FIGS. 1-3 is exemplary only. Depending on the transmitter architecture, there can be additions/alterations in transmitter inputs and outputs according to some embodiments. In some embodiments, the transmitter 10 is used in a cable modem having a design similar to the BCM3390 chipset, BCM3378 system on chip, or similar chipset.

With reference to FIG. 2, the main power amplifier circuit 12 of the transmitter 10 includes a transmit signal source 32, a main pre-equalizer 34, a digital to analog converter 36, a main power amplifier and a main power amplifier 38 in some embodiments. The replica power amplifier circuit 22 includes a training signal source 42, a replica pre-equalizer 44, a digital to analog converter 46, a replica power amplifier 48, an analog to digital converter 50, and a coefficient compute circuit 52 in some embodiments. The transmit path associated with the main power amplifier circuit 12 is similar to the replica path associated with the replica power amplifier circuit 22 in some embodiments.

The transmit signal source 32 is any source (e.g., a symbol source) for providing a signal for transmission using the main power amplifier circuit 12. The transmit signal source 32 provides a transmit signal in a digital format to the main pre-equalizer 34 in some embodiments. In some embodiments, the transmit signal is initiated by a user through selections in a user interface or by electronic equipment.

The amplified transmit signal on the signal line 16 can be provided at any frequency or duty cycle and can be provided as a quadrature amplitude modulated (QAM), quadrature phase shift keyed (QPSK), or other modulated signal by the power amplifier circuit 12. The transmit signal is a cable modem signal at various bandwidths, channels and data rates. In some embodiments, the amplified transmit signal is a burst signal 64. In some embodiments, the burst signal 64 is an upstream cable modem signal having varying amplitude over time. For example, the burst signal 64 can have periods of no signal followed by periodic signals at higher amplitudes (e.g., the signal appears and disappears).

The main pre-equalizer 34 provides a pre-equalized or pre-distorted digital transmit signal to the digital to analog converter 36. The transmit signal from the transmit signal source 32 is pre-distorted to correct for any impairment created by the main power amplifier 38. Alternatively, other components associated with the main power amplifier circuit 12 can provide impairments and the main pre-equalizer 34 provides the pre-equalized or pre-distorted transmit signal to reduce those impairments.

The main pre-equalizer 34 is a digital pre-distortion (DPD) circuit in some embodiments. In some embodiments, the main pre-equalizer 34 is a filter (e.g., a digital filter). The main pre-equalizer 34 is implemented in a processor executing software and/or circuitry. The main pre-equalizer 34 is a multiple tap equalizer in some embodiments. The main pre-equalizer 34 is an adaptive pre-equalizer that has a number of filter taps through which the transmit signal is passed. The filter taps are associated with the control signals (e.g., coefficients provided on the control line 24). The main pre-equalizer 34 can adjust for distortion according to various pre-distortion algorithms or techniques in some embodiments.

The digital to analog converter 36 provides an analog signal derived from the digital pre-distorted transmit signal provided by the main pre-equalizer 34 to the main power amplifier 38. The digital to analog converter 36 is any type of circuit or processor for converting a digital signal to an analog signal.

The main power amplifier 38 amplifies the analog, pre-distorted signal from the digital to analog converter 36. The amplification operation by the main power amplifier 38 can provide a distortion or signal impairment. The main power amplifier 38 is provided as an external board component with respect to other components of the main power amplifier circuit 12 discussed above. In some embodiments, the main power amplifier 38 is a variable gain amplifier comprised of a class A or other amplifier stage using metal oxide semiconductor (MOS) or bipolar junction transistor technologies.

The training signal source 42 is any source for providing a signal for training using the replica power amplifier 48. The training signal source 42 provides the training signal in a digital format to the replica pre-equalizer 44. In some embodiments, the amplified training signal is a non-burst signal 66. In some embodiments, the non-burst signal 66 is a consistent signal at various frequencies and is provided periodically (e.g., once every one, two, . . . , five, or ten minutes). In some embodiments, the non-burst signal 66 has a duty cycle of less than one percent. In some embodiments, the non-burst signal 66 is provided for 0.15 seconds every fifteen minutes. In some embodiments, the non-burst signal 66 is provided for 100 milliseconds (ms) every ten minutes. Alternative periodic and duty cycle schemes can be provided depending upon system parameters and components.

In some embodiments, the non-burst signal 66 is provided for a period of time at initialization and then provided periodically during operation. Generally, the non-burst signal 66 allows distortions associated with heating in the transmitter 10 to be corrected. Accordingly, when a constant temperature is reached in the transmitter 10 (e.g., after operation for a period of time), less training operations are needed. In some embodiments, the provision of the non-burst signal 66 is provided more frequently after initialization and less frequently after steady state operation. In some embodiments, the rate of provision of training signal is relatively frequent (e.g., once every minute) until the transmitter 10 has been operated for a threshold period of time (e.g., 5 minutes) at which time the training signal is provided at a fixed frequency (once every 10 minutes). Various schedules for proving the training signal in accordance with heating profiles, power considerations, and distortion requirements can be utilized.

The digital training signal from the training signal source 42 is pre-distorted by the replica pre-equalizer 44. The replica pre-equalizer 44 is a pre-distortion circuit similar to the main pre-equalizer 34. In some embodiments, the replica pre-equalizer 44 is a filter (e.g., a digital filter) implemented in a processor executing software and/or circuitry.

The pre-distorted training signal is provided by the replica pre-equalizer 44 to the digital analog to converter 46. The digital analog to converter 46 converts the digital pre-distorted training signal to analog form for reception by the replica power amplifier 48. The digital to analog converter 46 is similar to the digital to analog converter 36.

The replica power amplifier 48 provides an analog, pre-distorted, amplified training signal to a load 68. The load 68 is a scaled version of the load associated with the signal line 16 in some embodiments. The signal line 24 is a cable line, an antenna, an Ethernet line, etc. in some embodiments. The load 68 is programmable to match the signal line 16 or a scaled version thereof in some embodiments.

The replica power amplifier 48 is similar to the main power amplifier 38 in some embodiments. In some embodiments, the replica power amplifier 48 is a scaled version of the main power amplifier 38 (e.g., 1 to 5, 1 to 10, etc.) in some embodiments. Alternative scaled versions can be utilized. In some embodiments, the replica power amplifier 48 has the same circuit design as the main power amplifier 38 with smaller power consuming components. In some embodiments, the replica power amplifier 48 is a mirror of the main power amplifier 38.

The amplified training signal is provided to the analog to digital converter 50 which converts the amplified training signal to a digital signal for reception by a coefficient compute circuit 52. The analog to digital converter 50 samples the analog signal and provides a digital signal to the coefficient compute circuit 52. The analog to digital converter 50 is any type of circuit or processor for converting an analog signal to a digital signal.

The coefficient compute circuit 52 computes or provides the control signals (e.g., coefficients) for the replica pre-equalizer 44. In some embodiments, the coefficient compute circuit 52 is a processor configured by software or other circuit for providing coefficients for the replica pre-equalizer 44 such that the training signal is pre-distorted so that the amplified training signal has less distortion and is corrected for impairments created by the replica power amplifier 38. Feedback algorithms are applied in the coefficient compute circuit 52 to tune or appropriately generate the control signals for the replica pre-equalizer 44. In some embodiments, the replica pre-equalizer 44 applies the control signals to the training signal from the training signal source 42.

The control signals can also be provided via the control line 24 to the main pre-equalizer 34 such that the transmit signal from the transmit signal source 32 is appropriately pre-distorted. Accordingly, the training signal can be utilized to pre-distort the transmit signal to correct for any impairment created by the main power amplifier 38. The replica power amplifier 48 is configured to match the main power amplifier 38 so that corrections of impairments in the replica power amplifier 48 are consistent with corrections of impairments of the main power amplifier 38. In some applications, the replica power amplifier 48 has the same circuit configuration as the main power amplifier 38.

In some embodiments, the coefficient compute circuit 52 provides the control signals to the control line 24. In some embodiments, the coefficient compute circuit 52 provides control signals to the control line 24 that are versions of the control signals provided to the replica pre-equalizer 44. In some embodiments, the versions of the control signals provided to the main pre-equalizer 34 are calculated from the control signals provided to the replica pre-equalizer 44 with adjustments being made for differences in the transmit path of the main power amplifier circuit 12 and the replica path of the replica power amplifier circuit 22.

Various algorithms can be utilized to generate coefficients in coefficient compute circuit 52. In some embodiments, least squares fit, recursive least squares fit, and/or recursive least mean squares fit algorithms are used to determine the coefficients. In some embodiments, a sign matrix inversion process is utilized to provide the coefficients.

In some embodiments, the main power amplifier 38 and the replica power amplifier 48 are provided as external components to the remaining components in the main power amplifier circuit 12 and the replica power amplifier circuit 22. In some embodiments, the circuits associated with the main power amplifier circuit 12 and the replica power amplifier circuit 22 are provided in a signal processor or other digital device while the main power amplifier 38 and the replica power amplifier 48 are provided in an analog circuit component (e.g., in a single device 70). The main power amplifier 38 and the replica power amplifier 48 are provided on a single substrate and in the same integrated circuit package in some embodiments. In some embodiments, the main power amplifier 38 and the replica power amplifier 48 are disposed adjacent or near each other on the substrate so that both have the same temperature during operation.

With reference to FIG. 3, the transmitter 10 is utilized to provide an amplified transmit signal according to a flow 100 in some embodiments. At an operation 102, the training signal is received by the replica pre-equalizer 44 (FIG. 2). At an operation 104, the training signal is pre-distorted in accordance with coefficients provided by coefficient compute circuit 52.

At an operation 106, the training signal is amplified by the replica power amplifier 48. At an operation 108, coefficients are computed by the coefficient compute circuit 52 in response to the amplified training signal from the replica power amplifier 48.

The coefficient compute circuit 52 provides coefficients to the replica pre-equalizer 44 and the main pre-equalizer 34. The coefficients are applied during the operation 104. In addition, coefficients are applied in an operation 114 to pre-distort the transmit signal using the main pre-equalizer 34. At an operation 112, the transmit signal is received by the main pre-equalizer 34 and the transmit signal is pre-distorted in accordance with the coefficients computed at the operation 108 in the operation 114. At an operation 116, the pre-distorted transmit signal is amplified by the main power amplifier 38. At an operation 118, the pre-distorted, amplified transmit signal is provided to the main signal path (e.g., the signal line 16 in FIG. 1) by the main power amplifier 38.

Operations 112, 114, 116, and 118 are performed in accordance with the presence of a transmit signal. The transmit signal is generally provided in response to user and/or other system operations.

Operations 102, 104, 106, and 108 are performed in accordance with a training protocol. The training protocol can be performed on a periodic basis. For example, operations 102, 104, 106, and 108 are performed less frequently so that power is not wasted. For example, operations 102, 104, 106, and 108 are performed during a small percentage of the time that the transmitter 10 is operational.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Embodiments of the invention may be employed in senders of network elements of a 3GPP network. They may be employed also in senders of other mobile networks such as cable, CDMA, EDGE, UMTS, LTE, LTE-A, GSM, WLAN networks, etc. and also in other senders. In particular, they may be deployed in a terminal (terminal device, user equipment) of the respective technology which may be e.g. a mobile phone, a smart phone, a PDA, a laptop or any other terminal. Also, they may be deployed in base stations of the respective technology such as eNodeB, NodeB, BTS, Access Point, etc. or in wired network systems such as cable modems, internet routers, etc.

Names of network elements, protocols, and methods are based on current standards. In other versions or other technologies, the names of these network elements and/or protocols and/or methods may be different, as long as they provide a corresponding functionality.

The figures show logical or functional structures of example embodiments. They are not intended to show an arrangement of the components on a circuit board, substrate, etc. The arrangement of the components may or may not correspond to the logical or functional structure.

If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware.

Implementation of any of the above described blocks, apparatuses, systems, techniques or methods include, as non-limiting examples, implementations as hardware, software, firmware, special purpose circuits or logic, general purpose hardware or controller or other computing devices, or some combination thereof.

Such hardware may be hardware type independent and may be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), graphene, etc., using for example ASIC (Application Specific) IC (Integrated Circuit) components, FPGA (Field-programmable Gate Arrays) components, CPLD (Complex Programmable Logic Device) components or DSP (Digital Signal Processor) components, MOS components (e.g. transistors) may be implemented in NMOS or PMOS technology. Different MOS components may be based on the same or different of these technologies.

A device/apparatus may be represented by a semiconductor chip, a chipset, or a (hardware) module comprising such chip or chipset; this, however, does not exclude the possibility that a functionality of a device/apparatus or module, instead of being hardware implemented, be implemented as software in a (software) module such as a computer program or a computer program product comprising executable software code portions for execution/being run on a processor. A device may be regarded as a device/apparatus or as an assembly of more than one device/apparatus, whether functionality in cooperation with each other or functionality independently of each other. The components of a device may be in a same device housing or in different device housings.

For example, method steps may be implemented in software, firmware, or hardware, in the latter case using any known or future developed hardware technology, or any hybrids of these, as described hereinabove. The method steps may be implemented in a mixture of software, firmware, and hardware.

Various embodiments of user equipment may include, but are not limited to, mobile stations, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless access and browsing, as well as portable units or terminals that incorporate combinations of such functions.

As used in this application, the terms "circuit" or "circuitry" refers at least to all of the following:
  a. to hardware-only circuit implementation (such as implementable in only analog and/or digital circuitry), and
  b. to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions, and c. to circuits, such as a microprocessor(s) or a portion of a microprocessor(s), that require software or firmware for operation, even if the software or firmware is not physically present.

This definitions of "circuit" or "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The terms "circuit" or "circuitry" would also cover, for example and if applicable to the particular claim element, a baseband integrated circuit or applications processor integrated circuit for a mobile phone or a similar integrated circuit in a server, a cellular network device, or other network device.

It is to be understood that what is described above is what is presently considered the preferred embodiments of the present invention. However, it should be noted that the description of the preferred embodiments is given by way of example only and that various modifications may be made without departing from the scope of the invention as defined by the appended claims. That is, the above embodiments are to be understood as illustrative examples of the invention. Further embodiments of the invention are envisaged.

What is claimed is:

1. A transmitter circuit, comprising:
   a main pre-equalizer configured to pre-distort a burst signal;
   a main power amplifier configured to receive the pre-distorted burst signal and generate an amplified burst signal using the pre-distorted burst signal;
   a replica pre-equalizer configured to pre-distort a non-burst signal; and
   a replica power amplifier, the replica power amplifier configured to receive the pre-distorted non-burst signal from the replica pre-equalizer and generate an amplified non-burst signal using the pre-distorted non-burst signal, wherein control signals are provided to the main pre-equalizer to pre-distort the burst signal, the control signals being provided using the amplified non-burst signal of the replica power amplifier.

2. The transmitter circuit of claim 1, further comprising:
   a control circuit in communication with the replica pre-amplifier and configured to provide the control signals.

3. The transmitter circuit of claim 2, wherein the control circuit comprises a coefficient computing circuit and the control signals are transfer coefficients provided to the main pre-equalizer and are provided by the replica pre-equalizer.

4. The transmitter circuit of claim 3, further comprising a digital to analog converter disposed between the main pre-equalizer and the main power amplifier.

5. The transmitter circuit of claim 4, further comprising:
   an analog to digital converter disposed between the control circuit and the replica power amplifier; and
   a digital to analog converter disposed between the replica pre-equalizer and the replica power amplifier.

6. The transmitter circuit of claim 1, wherein the main power amplifier provides a burst signal.

7. The transmitter circuit of claim 1, wherein the main power amplifier provides a transmit signal for a cable modem.

8. A method of amplifying a transmit signal, the method comprising:
   pre-distorting a training signal, wherein the training signal is a non-burst signal;
   amplifying the training signal in a first amplifier;
   using an amplified training signal from the first amplifier to provide a control signal;
   pre-distorting the transmit signal using the control signal, wherein the transmit signal is a burst signal; and
   amplifying the transmit signal in a second amplifier, the first amplifier having the same or similar configuration to the second amplifier.

9. The method of claim 8, wherein the control signal is used for pre-distorting the training signal.

10. The method of claim 8, wherein the training signal is a user defined signal.

11. The method of claim 8, wherein the second amplifier is operated in a low power mode and has higher distortion when operated in the low power mode without pre-distorting the transmission signal as compared to operation a higher power mode.

12. The method of claim 8, wherein the second amplifier is a main power amplifier for the transmitter and has substantially the same distortion when operated in the low power mode with pre-distorting the transmission signal as the main amplifier has in a higher power mode.

13. The method of claim 8, wherein the first amplifier is a scaled-down version of the second amplifier.

14. The method of claim 8, wherein pre-distorting the training signal, amplifying the training signal in first amplifier, and using an amplified training signal from the first amplifier to provide the control signal is performed in a duty cycle of less than 1 percent.

15. The method of claim 8, wherein pre-distorting the training signal, amplifying the training signal in first amplifier, and using an amplified training signal from the first amplifier to provide the control signal is performed less often than once per minute.

16. A modem, comprising:
   a main pre-distortion circuit configured to pre-distort a transmit signal according to a set of coefficients or a version of the set of the coefficients and provide a first pre-distorted signal;
   a main power amplifier configured to amplify the first pre-distorted signal;
   a replica pre-distortion circuit configured to pre-distort a training signal according the set of coefficients and provide a second pre-distorted signal, wherein the transmit signal is a burst signal and the training signal is a non-burst signal;
   a replica power amplifier configured to amplify the second pre-distorted signal and provide an amplified signal; and
   a coefficient computing circuit configured to receive the amplified signal or a version of the amplified signal and provide adjustments to the set of coefficients.

17. The modem of claim 16, wherein the amplified first pre-distorted signal is provided to a cable modem up link transmit path.

18. The modem of claim 16, further comprising:
   a first digital to analog converter disposed between the main pre-distortion circuit and the main power amplifier;
   a second digital to analog converter disposed between the replica pre-distortion circuit and the replica power amplifier; and
   an analog to digital converter disposed between the coefficient computing circuit and the replica power amplifier.

19. The modem of claim 16, wherein the coefficient computing circuit uses a least squares fit or sign matrix inversion technique to provide the set of coefficients and wherein the training signal is provided once every 15 minutes or less for a period of 100 milliseconds or less.

* * * * *